United States Patent [19]

McWilliams

[11] 4,357,601
[45] Nov. 2, 1982

[54] TAMPER PROTECTION FOR AN AUTOMATIC REMOTE METER READING UNIT

[75] Inventor: Stephen G. McWilliams, Greenwood, Ind.

[73] Assignee: Bell Telephone Laboratories, Incorporated, Murray Hill, N.J.

[21] Appl. No.: 183,362

[22] Filed: Sep. 2, 1980

[51] Int. Cl.³ ............................................. G08B 21/00
[52] U.S. Cl. .................................... 340/506; 340/512; 340/870.02; 340/870.09
[58] Field of Search ............... 340/506, 507, 512, 637, 340/688, 870.09, 870.02, 541, 545

[56] References Cited

U.S. PATENT DOCUMENTS 3,440,636  4/1969  Sliman ................................. 340/568
3,668,681  6/1972  Kaplan ................................ 340/568
4,032,916  6/1977  Galvin et al. ....................... 340/541

Primary Examiner—Glen R. Swann, III
Attorney, Agent, or Firm—S. R. Williamson

[57] ABSTRACT

In an automatic remote meter reading system, a tamper protection circuit (101) provides an alarm signal at a central station upon the disconnecting or tampering with a remote utility meter (100). Tamper protection is provided for the meter and for the transmission line carrying energy usage information to a transponder (500) such that any interruptions of the circuit path causes an alarm to be generated. The circuitry includes a remote resistance (132) associated with each meter to be protected. The value of the remote resistance is continually compared with a resistance (110) having a given value within the tamper protection circuit such that for any changes in the value of the remote resistance, an imbalance in the tamper circuit occurs and the alarm signal is generated.

8 Claims, 4 Drawing Figures

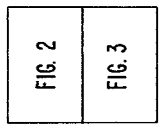
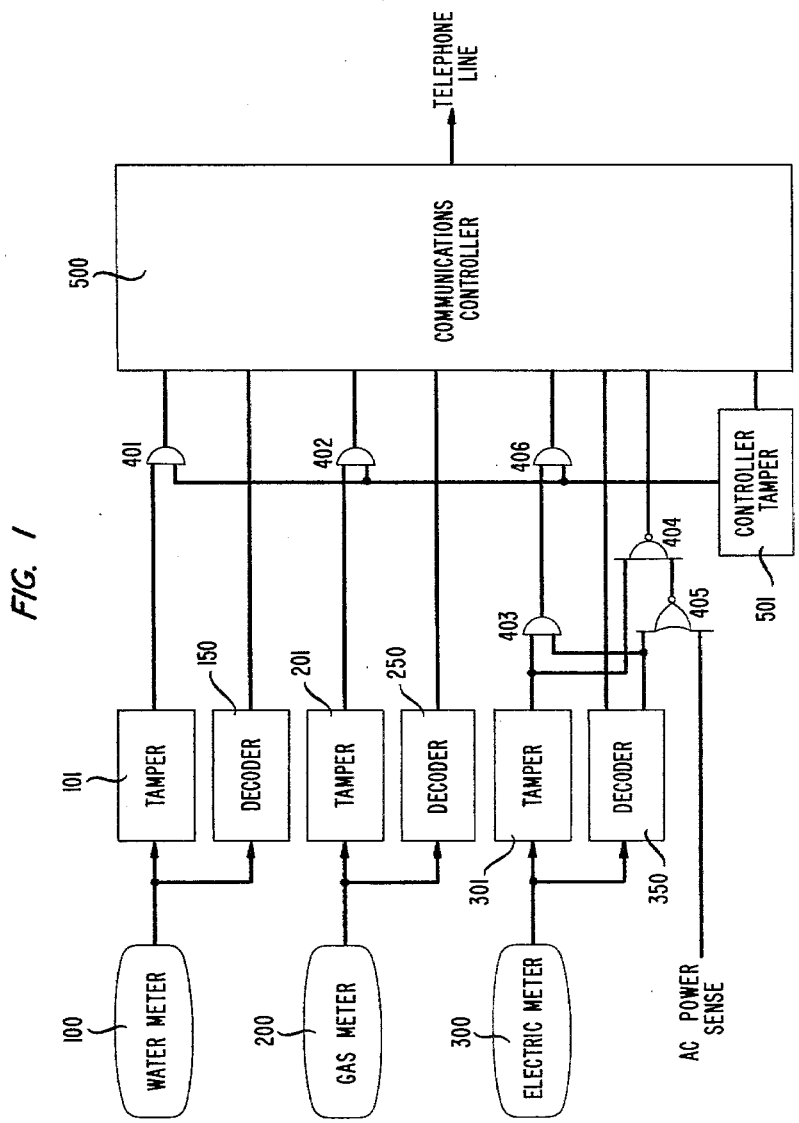

TAMPER PROTECTION FOR AN AUTOMATIC REMOTE METER READING UNIT

BACKGROUND OF THE INVENTION

1. Technical Field

The present invention relates to alarm systems and, more particularly, to an alarm system adapted for use in an energy management system.

2. Description of the Prior Art

Many utilities are beginning to consider the remote reading of meters as a cost effective way of determining electric, gas, and water consumption. The remote reading of meters avoids the time and effort required to manually take the periodic readings of each meter and also avoids the uncertainty of being able to read a meter at a remote location where access to the meter must be provided and the occupants are away. Generally speaking, remote meter reading systems basically comprise an encoder device which is attached to the existing meter to sense the meter reading, storage means for storing the sensed reading, and transponder means for selectively transmitting such information over an associated communications link to a central station in response to an interrogation signal from such station.

Although technical problems relating to the reliability of remote meter reading systems have been overcome, the cost of providing such a system has heretofore been rather high. As the production of services becomes an ever increasing cost to utility companies, however, the remote reading of meters becomes more economically attractive. Moreover, remote meter reading allows the utility companies to reliably obtain the reading from each meter periodically regardless of outside factors such as weather, manpower, and the like.

The increased cost in the production of services to the utility companies is generally reflected in the expense of these services to the consumer. And in some remote reading units, it is possible for an unauthorized person to gain access to the internal circuitry of the meter and cause the encoder device to provide inaccurate usage information for transmission to a centrally located receiving station. It is important, therefore, for the utility company to have a means for detecting an attempt to disconnect the meter or tamper with the lines connected thereto.

SUMMARY OF THE INVENTION

In accordance with the invention, a tamper protection circuit gives a warning at a central location upon the disconnecting or tampering with a remote meter unit. Tamper protection is provided for the meter and for the wire pair carrying the usage information such that any interruption of the circuit path causes an alarm to be generated. The circuitry includes a remote resistance associated with each remote meter to be protected. This remote resistance value is compared with a resistance having a give value within the tamper circuitry such that for any changes in the value of the remote resistance, an imbalance in the tamper circuit occurs generating an alarm signal. Reference voltages for the tamper circuitry are obtained internally by arrangement of transistors therein such that the base-to-emitter voltage drop of the transistors and a voltage drop provided by a diode combine to bias the transistors at just below their turn-ON value. In that these reference voltages tend to track the supply voltage, the tamper circuit is relatively insensitive to supply voltage variations.

BRIEF DESCRIPTION OF THE DRAWING

The invention and its mode of operation will be more clearly understood from the following Detailed Description when read with the appended drawings in which:

FIG. 1 is a block diagram illustrating the major functional components of the remote meter reading unit and their general interconnection with each other;

FIG. 4 illustrates the working spatial arrangement of FIGS. 2 and 3.

Throughout the drawings, the same element, when shown in more than one figure, is designated by the same reference numeral.

DETAILED DESCRIPTION

Figure 2:
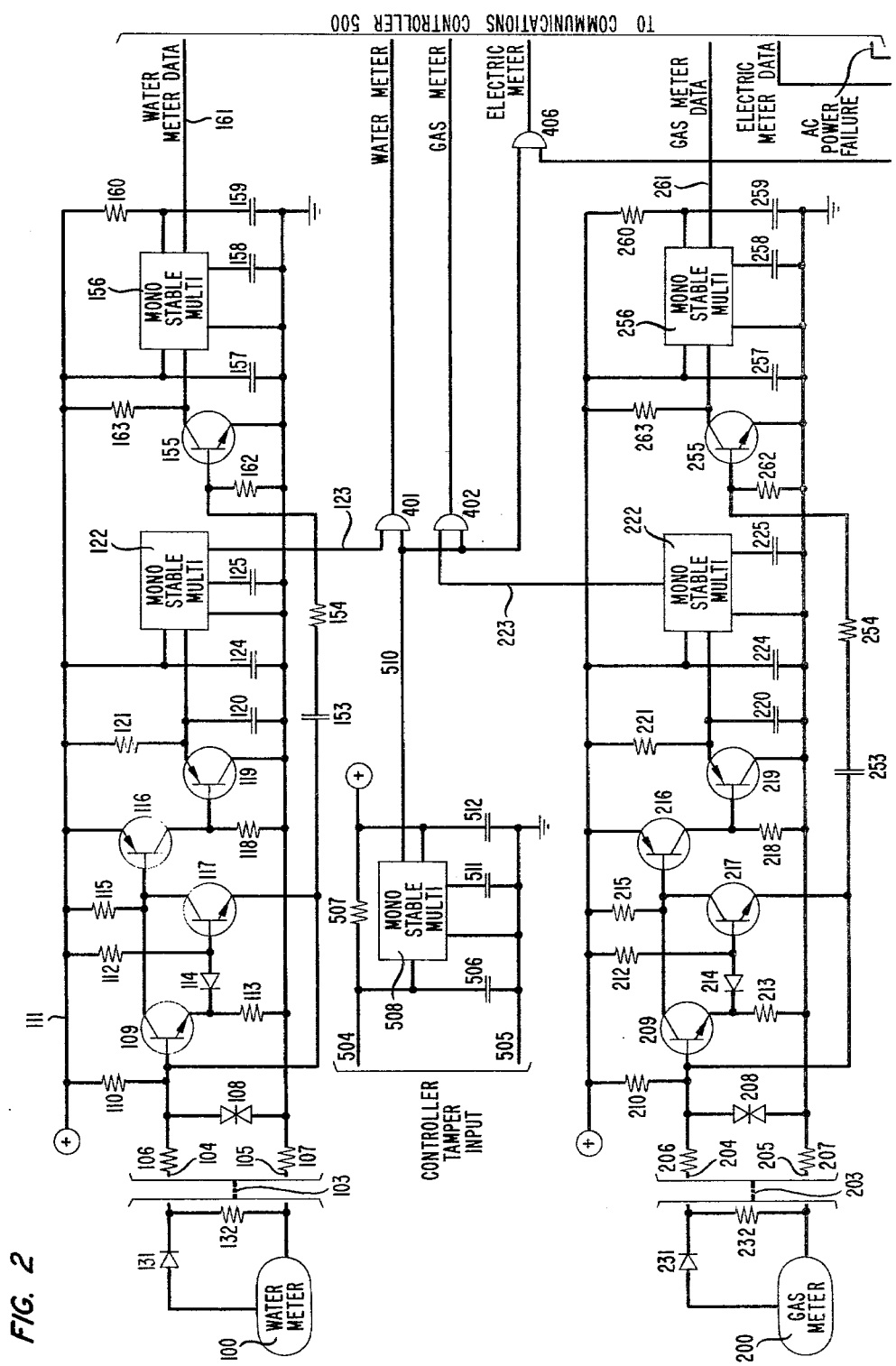
FIGS. 2 and 3 depict a schematic diagram of an illustrative remote meter reading unit and disclose in particular detail the circuitry associated with the block diagram illustrated in FIG. 1.

Referring now to FIG. 1 of the drawings in accordance with the present invention, there is shown a block diagram of a tamper protection arrangement in an automatic remote meter reading unit. In the operation of the arrangement, signals reflecting a tamper from a water meter 100, a gas meter 200 and an electric meter 300 are provided to respective tamper circuits 101, 201, and 301 which transmit this information onto a communications controller 500. These tamper signals are provided whenever the meters are disconnected or the lines connected thereto tampered with. The class of tampers which can be detected includes open and shorted lines, and the series or parallel connection of additional resistance to the lines. These resistors would be connected with the intention of simulating the remote resistance by connecting this resistance, in either series or parallel, and then removing (opening or shorting) the remote resistance. Signals reflecting usage information from the meters are transmitted to respectively associated decoder circuits 150, 250, and 350 which, in turn, change this information to a form suitable for transmitting to the communications controller 500. To provide security for the communications controller 500, it also has an associated tamper circuit 501 that will be activated whenever access to its circuitry is obtained by an unauthorized person.

In the event of a water meter tamper, the output of tamper circuit 101 which is normally at a logic one will go to a logic zero. This signal is coupled to one of the two inputs of AND gate 401. The second input to AND gate 401 has the output of the controller tamper circuit 501 which is also normally at a logic one. Changing the output of tamper circuit 101 to a logic zero also causes the output of AND gate 401 to go to a logic zero. This signal is coupled to the communications controller 500 and is interpreted as a water meter tamper.

The gas meter tamper circuit 201 operates similar to the water meter tamper circuit 101. For a gas meter tamper, the output of tamper circuit 201 which is normally at a logic one goes to a logic zero. This signal is coupled to one of the two inputs of AND gate 402. The second input to this gate is the output of the controller tamper 501 which is also normally at a logic one. The output of tamper circuit 201 changing to a logic zero causes the output AND gate 402 to also go to a logic zero. This signal is coupled to the communications controller 500 and is interpreted as a gas meter tamper.

For an electric meter tamper, the output of tamper circuit 301 which is normally at a logic one will go to a logic zero. This signal is coupled to one of the two inputs of AND gate 403 and to one of the two inputs of NAND gate 404. Decoder circuit 350 also includes a tamper section, to be described in detail later herein, that provides a logic zero output for an electric meter tamper. This signal is coupled to the second input of AND gate 403 and to one of the two inputs of NOR gate 405. If the ac power is present at the electric meter, an ac power sense signal indicating that a power failure has not occurred will be present on the second input of NOR gate 405 in the form of a logic one. Either or both of the two logic zeros on the inputs of AND gate 403 causes a logic zero at its output. This signal is coupled to the first of two inputs of AND gate 406. The second input of AND gate 406 is the output of the controller tamper 501 which is normally at a logic one. AND gate 406, due to the logic zero on its first input, thus provides a logic zero at its output. This signal is coupled to the communications controller 500 and is interpreted as an electrical meter tamper.

In the event of an ac power failure, AND gate 406 will again provide a logic zero output to the communications controller 500 indicating an electrical tamper because of the tamper section in decoder 350 going from a logic one to a logic zero. To avoid interpreting this power failure as a tamper, the ac power sense signal is also coupled via NOR gate 405 and NAND gate 404 to the communications controller 500. When the ac power sense signal goes to a logic zero, the output of NOR gate 405 which, at this point, will have a zero on both inputs, goes to a logic one. This logic one is coupled to one of the two inputs of NAND gate 404 which, at this time, has a logic one from the output of the tamper circuit 301 connected to its remaining input. The tamper circuit 301 provides the logic one output because it does not sense the ac power failure, but rather, only a tamper to the electric meter or line connected thereto which in this instance has not occurred. Both inputs of NAND gate 404, being at a logic one, cause its output to be at a logic zero. This output is provided to the communications controller 500 as an ac power failure. Circuitry (not shown) within the communications controller 500 thus looks at the electrical tamper signal present, and also the ac power failure signal present, and decides that the electrical tamper signal is false, and that an ac power failure has occurred.

A controller tamper signal is produced in the tamper circuit 501. This tamper circuit provides a logic zero output whenever the door to the controller 500 is opened. This logic zero output is coupled to AND gates 401, 402, and 406. With no tamper occurring to either of the meters, and with the ac sense signal present, a controller tamper is interpreted by circuitry within the controller 500 as being all of the meter tamper signals being generated at once.

Under normal operating conditions, the communications controller 500 stores the usage information provided by the decoders 150, 250, and 350 for transmission over the telephone line to a central station in response to an interrogation signal from such station. If a tamper occurs to the remote meter reading unit, this information is similarly entered into the controller 500 and transmitted to the central station.

Figure 3:
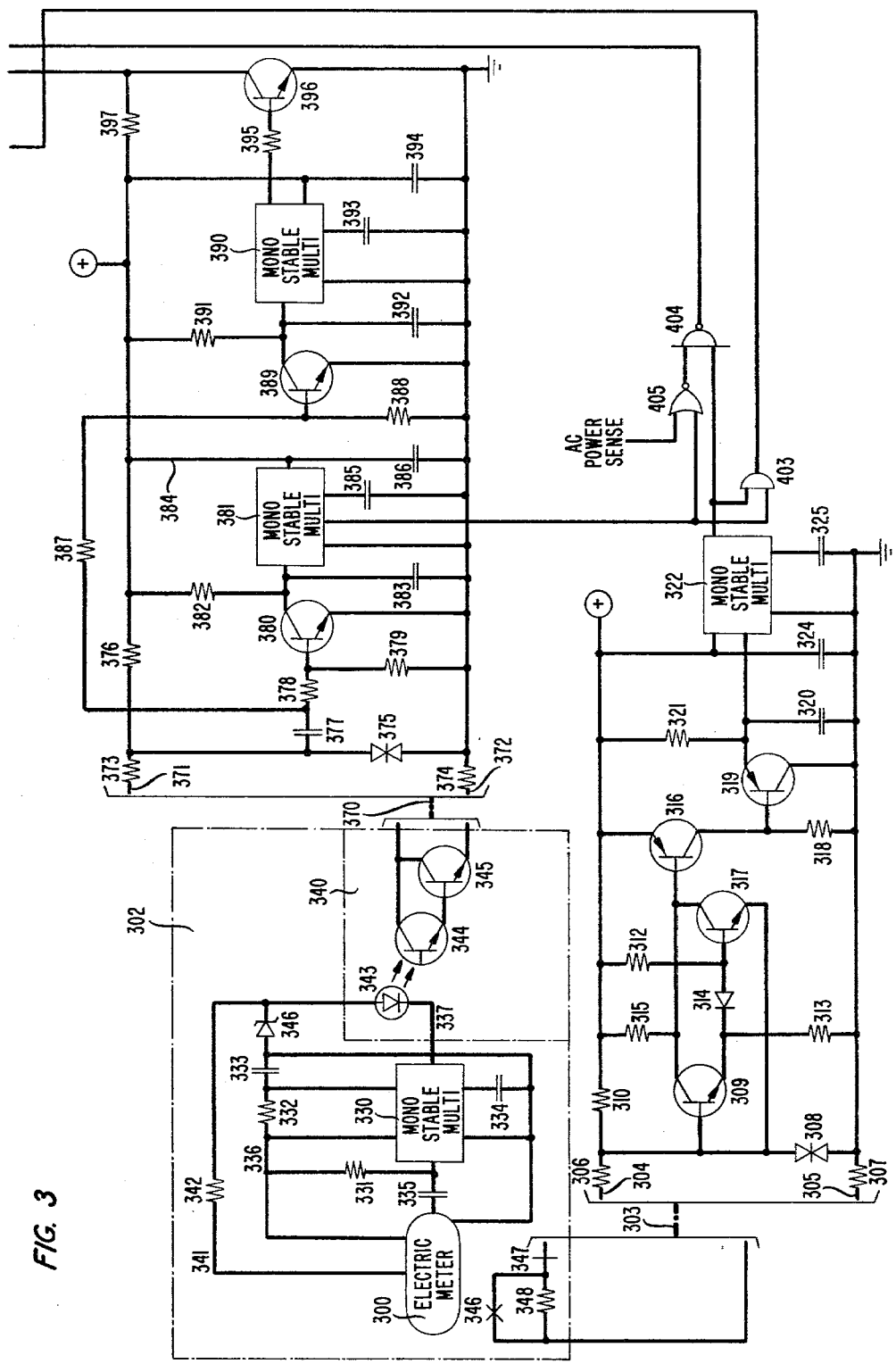

The individual component sections of FIG. 1 are more thoroughly understood by reference fo FIGS. 2 and 3 which are arranged in accordance with FIG. 4. These figures depict a schematic diagram of an illustrative remote meter reading unit and disclose in particular detail the circuitry associated with the component sections of FIG. 1.

With reference to FIG. 2, there is shown the water meter 100 and gas meter 200 which provide usage information through respectively associated encoders for further transmission to the decoder sections and the communications controller. The water meter 100 and the gas meter 200, which are commercially available from suppliers such as Hershey Products, Inc. and American Meter Co., respectively, have internal encoders (not shown) which operate essentially in the same manner. Each of these encoders contains a small dc generator which produces a pulse after a certain unit volume has been passed through the meter. External electrical power is not necessary for providing this pulse since a register within the meter rotates with the flow of water or gas and winds a clock spring connected to the dc generator. After a predetermined number of revolutions of the register corresponding to a particular unit volume, the armature of the generator is released producing the electrical pulse.

In the water meter arrangement in accordance with this invention, the pulse is transmitted through a diode 131 which isolates the dc generator from a resistor 132 and the remainder of the tamper protection circuitry. Registor 132 is part of a comparator section, the balance of which is located in the tamper protection circuitry. Diode 231 and resistor 232 similarly isolate and comprise part of a comparator section, respectively, in the tamper protection circuitry for the gas meter arrangement.

The water meter is connected to the tamper protection circuit via encoder cable 103 which contains lines 104 and 105. Resistors 106 and 107 on lines 104 and 105, respectively, ae surge-limiting resistors and operate in conjunction with varistor 108 to provide protection for the tamper protection circuitry input in case a hazardous voltage appears on the encoder cable 103. Input line 104 is connected via resistor 106 to the base of transistor 109 and one side of resistor 110, the opposite side of resistor 110 being connected to the positive supply voltage on line 111. Resistor 132 and resistor 110 form a voltage divider with resistance values such that the potential at the base of transistor 109 is one-half the supply voltage found on line 111 in the normal quiescent state. Resistors 112 and 113 are of equal value and also form a voltage divider such that the emitter of transistor 109 is also approximately one-half of the supply voltage and, therefore, transistor 109 is OFF. A tamper protection circuit is possible, and contemplated by this invention, in which resistors not of equal value are chosen to form the voltage dividers.

More specifically, and with transistor 109 as a silicon transistor, the emitter of transistor 109 and its base differ by about 3/10ths of a volt. In operation with a supply voltage of five volts, the voltage on the base of transistor 109 is equal to half of the supply voltage or 2.5 volts. The voltage on the emitter of transistor 109 is equal to half of the supply voltage minus a voltage drop caused by diode 114 or, in this example, 2.175 volts (assuming diode 114 is a silicon diode with a 0.65 voltage drop). Thus, transistor 109 has a $V_{BE}$ of 0.325 volts (2.5 volts minus 2.175 volts) and is within approximately 3/10ths of a volt from turning ON.

A tamper that increases the remote resistance on cable 103 raises the base voltage of transistor 109. Once this base voltage is increased to above the 3/10ths of a volt threshold, current is drawn through resistor 115, as a result of transistor 109 turning ON. Transistor 116, which has its base coupled to the collector of transistor 109, is turned ON, thereby reflecting this increase in value of the remote resistance.

To guard against a tamper that would result in a decrease in the remote resistance, the arrangement utilizes a transistor 117, which is also a silicon transistor in this embodiment. Connected to the anode side of the diode 114 in the divider circuit comprising resistor 112, diode 114, and resistor 113, the base of transistor 117 is held at 2.825 volts when the tamper circuit is in the quiescent state. The emitter of transistor 117 is commonly connected with the base of transistor 109 to the divider network comprising resistors 132 and 110 and is, therefore, at a potential of one-half the supply voltage on line 111. Transistor 117 is thus also OFF and approximately 3/10ths of a volt from being turned ON. Decreasing the remote resistance on cable 103 causes the emitter voltage of transistor 117 to also be reduced in level. When the 3/10ths of a volt threshold level is reached, transistor 117 turns ON causing collector current to flow through resistor 115. This, in turn, also turns ON transistor 116 reflecting the decrease in the value of the remote resistance.

As is apparent from the above, in the quiescent state there is an equilibrium condition in which transistors 109 and 117 are both OFF. As the value of the remote resistance increases, it turns transistor 109 ON. The emitter of transistor 117 also goes high and transistor 117 gets turned OFF even further so that only transistor 109 is ON when the remote resistance increases. If the remote resistance decreases, transistor 117 turns ON, and the base of transistor 109 goes negative. Since its emitter remains constant, transistor 109 will be turned even further OFF. Thus, only one of the transistors 109 or 117 is ON at any given time. The same polarity of output signal, however, results from either being ON. That is, a positive voltage signal is developed across resistor 118 for each change in the remote resistance regardless of the direction of the change.

In that the reference voltages provided for the emitter of transistor 109 and the base of transistor 117 tend to track the supply voltage, and that the voltage formed by the divider composed of the remote resistance and resistor 110 also tracks the supply voltage, this circuit is relatively insensitive to supply voltage variations.

When the tamper circuit is in equilibrium and transistors 109 and 117 are OFF, transistor 119 is ON effectively shorting capacitor 120. This causes the midpoint of the resistor 121 and capacitor 120 combination to be held at a logic zero. This midpoint is also the input of a monostable multivibrator 122. This monostable multivibrator incorporates the art of U.S. Pat. No. 3,432,772, issued to J. A. Johnsen et al. on Mar. 11, 1969 in an integrated circuit arrangement, as do each of the other monostable multivibrators subsequently referred to herein. Associated with the monostable multivibrator 122 are capacitors 120, 124, and 125 and resistor 121. When the transistor 119 is ON, the output of the monostable multivibrator 122 on line 123 is a logic one. If transistor 119 is turned OFF because of a tamper, approximately one second later the output of monostable multivibrator 122 on line 123 goes to a logic zero. Once the multivibrator 122 changes state its output will remain at a logic zero until transistor 119 is turned ON again. This tamper signal is coupled via AND gate 401 to the communications controller 500. When transistor 119 turns ON, this indicates that the tamper circuit is again in equilibrium.

The one-second response period in the changing of the output state of monostable multivibrator 122 is for allowing water usage information to be transmitted over the two-wire pair 104 and 105 in the cable 103 without activating the tamper circuit. For this usage information causes a voltage inbalance on the cable 103 that would activate the tamper circuit. This is avoided by transmitting the usage information in a much smaller time period than that necessary to trigger the tamper circuit.

After the water meter encoder registers the passage of a certain number of cubic feet, the dc generator therein sends out usage information in the form of a pulse train whose total length is on the order of 50 milliseconds. This pulse train is coupled from line 104 via resistor 106, capacitor 153, and divided between resistors 154 and 162 at the base of transistor 155. The leading edge of the pulse train turns ON transistor 155 causing current to flow in resistor 163 and thereby activating monostable multivibrator 156. This monostable multivibrator with associated components comprising capacitors 157, 158, and 159, and resistor 160 has a time period of approximately 500 milliseconds and thus provides a single 500-milliseconds pulse on line 161 to the communications controller 500.

Circuitry similar to that used in implementing the water meter tamper protection arrangement is used in the gas meter tamper protection arrangement. Because of this similarity and the detailed description given that arrangement, the gas meter arrangement is not described in similar detail since clarity of operation should be readily apparent from the description of the water meter arrangement.

The gas meter is connected to its tamper protection circuit via cable 203 which contains lines 204 and 205. Series resistors 206 and 207 in combination with varistor 208 provide surge protection for the circuit input. The value of the resistor 210 and the remote resistance provided via the cable are compared by transistors 209 and 217. Both of these transistors are OFF when the remote resistance and resistor 210 have the same value. An increase in the remote resistance causes transistor 209 to turn ON. This, in turn, activates transistor 216 which turns OFF transistor 219. A decrease in the remote resistance causes transistor 217 to turn ON and similarly turns ON transistor 216 and turns OFF transistor 219. Additional components associated with this section of the gas meter tamper protection arrangement are resistors 212, 213, 215, and 218 and diode 214.

Connected to the emitter of transistor 219 is a monostable multivibrator 222 with associated components consisting of capacitors 220, 224, and 225 and a resistor 221. A tamper, which turns transistor 219 OFF, causes the output of monostable multivibrator 222 to change from a logic one to a logic zero. This tamper must persist for one second in order to change the output state of monostable multivibrator 222. Voltage variations on the cable 203 with a shorter time period on the order of 50 millisconds are indicative of the usage of a certain number of cubic feet of gas and do no activate the tamper circuitry.

These voltage variations comprise a pulse train and are coupled from line 204 via resistor 206, capacitor 253, and divided between resistors 254 and 262 at the base of transistor 255. The leading edge of this pulse train turns ON transistor 255 causing current to flow in resistor 263 and thereby activating monostable multivibrator 256. This monostable multivibrator, with associated components comprising capacitors 257, 258, and 259 and resistor 260, has a time period of approximately 500 milliseconds and provides a single 500-millisecond pusle on line 261 to the communications controller 500.

The communications controller 500 which collects the various usage information for transmission to a central station is usually located in an accessible location on the premises. Due to its accessibility, it is also important to guard against a tamper to circuitry therein, since a tamper to this circuitry would also provide incorrect user information to the central station. Thus, controller security is maintained by a switch mounted on the controller housing door such that if, for any reason, the door is opened, a signal indicating this condition is also transmitted to the central station. Similar to the gas and water meter tamper circuits, this tamper circuitry also employs a monostable multivibrator 508. Lines 504 and 505 comprise the controller tamper input lines and connect this circuit to a swithc (not shown) in the controller housing door. Capacitor 506 and resistor 507 control the monostable multivibrator circuitry such that opening the housing door for more than one second causes the output of the monostable multivibrator 508 on line 510 to go to a logic zero. This signal is coupled to the communications controller 500 through one of the two inputs on each of the three AND gates 401, 402, and 406. Other components associated with monostable multivibrator 508 are capacitors 511 and 512.

Referring now to FIG. 3, electrical usage information is provided to the controller through use of an external encoder section 302 which obtains electrical usage information from the electric meter 300. This meter is commercially available from suppliers such as General Electric and Westinghouse. The external encoder section 302 incorporates a monostable multivibrator 330 which is activated whenever a designated unit of electrical energy has been used. Associated with this multivibrator 330 are resistors 331 and 332 and capacitors 333, 334, and 335. Power for the encoder is derived from the electric meter 300 over line 336.

When the monostable multivibrator 330 is in its quiescent state, its output on line 337 is at a logic zero. A usage information signal in the form of a negative-going pulse is coupled from the electric meter 300 to the multivibrator 330 via capacitor 335. This signal reflects the passage of an electrical consumption unit and causes the output of the monostable multivibrator 330 on line 337 to go to a logic one. This output remains at a logic one for a time period determined by resistor 332 and capacitor 333.

Attached to the output of the monostable multivibrator is an opto-isolater 340 which couples the electrical energy usage information onto the cable 370. Line 341 connects a 60-Hz half-wave rectified waveform from the electric meter 300 to the opto-isolator 340 via series resistor 342. With the output of the monostable multivibrator 330 at a logic zero, light-emitting diode 343 is modulated at a 60-Hz rate and, in turn, activates and deactivates a phototransistor pair 344 and 345 at this rate. When the monostable multivibrator 330 is activated, its output goes to a logic one and the diode 343 turns OFF. Zener diode 346 limits the voltage on the anode of diode 343 to a positive level less than the logic one level on line 337 to ensure that the monostable multivibrator 330 turns OFF diode 343. After the output of the monostable multivibrator 330 returns to a logic zero, diode 343 resumes modulating the phototransistor pair 344 and 345.

The 60-Hz signal provided by the opto-isolator 340 is coupled over lines 371 and 372 in cable 370 to the electrical decoder circuitry. Resistors 373 and 374 in combination with varistor 375 limit the level of the voltage developed on the cable 370 that can enter the decoder circuitry. Resistor 376 is connected to the positive supply voltage and provides the load resistance for the transistor pair 344 and 345 in the opto-isolator 340. Capacitor 377 couples the input signal to the voltage divider comprising resistors 378 and 379. Transistor 380 has its base coupled to the midpoint of this divider and serves as an ON-OFF switch for the monostable multivibrator 381. Under normal operating conditions transistor 380 is activated at a 60-Hz rate preventing resistor 382 from charging capacitor 383 up to the turn-ON voltage of the multivibrator 381. When transistor 380 is ON, the output of the monostable multivibrator 381 which is on line 384 is normally at a logic one. If transistor 380 is turned OFF and remains OFF for approximately one second, the output of the monostable multivibrator 381 goes to a logic zero. This signal is interpreted as a tamper and coupled to one of the two inputs of both AND gate 403 and NOR gate 405 for further coupling to the communications controller 500. Associated with the monostable multivibrator 381 are capacitor 385 which provides a bypass for some of the internal voltage reference circuitry, and capacitor 386 which provides a power supply bypass.

Input capacitor 377 also couples the input signal, via a voltage divider network comprising resistors 387 and 388, to the base of transistor 389. This transistor 389 is bridged across the timing circuitry for monostable multivibrator 390. When transistor 389 is ON, the output of the monostable multivibrator 390 is at a logic one. If transistor 389 is turned OFF and remains OFF for 100 milliseconds, which reflects the reception of the usage information signal, the output of monostable multivibrator 390 goes to a logic zero. As with the monostable multivibrator 381, again, under normal operating conditions the 60-Hz carrier rate prevents the resistor 391 from charging capacitor 392 to a voltage level sufficient to activate the monostable multivibrator 390. Capacitors 393 and 394 ae employed as bypass capacitors for the monostable multivibrator 390. Resistor 395 couples the output of monostable multivibrator 390 to a transistor 396. This transistor with its load resistor 397 inverts the usage information signal before coupling it to the communications controller 500.

Since the source of energy providing the carrier signal comes from the electric meter, a number of occurrences can cause the signal to disappear. One example would be physically tampering with the cable, such as placing a short or an open thereupon. A second would be if the electric meter were unplugged from its socket. A third would be a true power outage if power from the electric-providing utility was interrupted. It is important, therefore, to be able to differentiate between a tamper and a true power outage.

A physical tamper circuit responds to tampering caused by the opening or closure of a switch, which could be due to, for example, the removal of the meter or a magnetic field detector sensing the presence of a strong external magnetic field. A physical tamper signal is provided to the circuit over wire pair 304 and 305 in cable 303 by either normally opened switch 346 or normally closed switch 347 changing its state. This circuit is very similar to the water meter and gas meter tamper circuit designs in that it compares the remote resistance on a cable with a local internal reference resistance. Input resistors 306 and 307 serve in conjunction with varistor 308 to prevent any damage to the internal circuitry by hazardous voltage present on the cable 303. The value of the resistor 310 and the remote resistance provided by resistor 348 via the cable 303 are compared by transistors 309 and 317. Both of these transistors are OFF when the remote resistance and resistor 310 have the same value. An increase in the remote resistance causes transistor 309 to turn ON. This, in turn, activates transistor 316, which turns OFF transistor 319. On the other hand, a decrease in the remote resistance causes transistor 317 to turn ON and, similarly, turns ON transistor 316 and turns OFF transistor 319. Additional components within the circuit are resistors 312, 313, 315, and 318, and diode 314.

Connected to the emitter of transistor 319 is a monostable multivibrator 322 with associated components consisting of capacitors 320, 324, and 325, and resistor 321. A tamper, which turns transistor 319 OFF, causes the output of the monostable multivibrator 322 to change from a logic one to a logic zero. This tamper must persist for one second in order to activate the monostable multivibrator 322. This output signal is coupled to one of the two inputs of AND gate 403 and NAND gate 404 for further coupling to the communications controller 500.

Various modifications of this invention are contemplated and may obviously be resorted to by those skilled in the art without departing from the spirit and scope of the invention as hereinafter defined by the appended claims.

I claim:

1. A tamper protection arrangement comprising a resistance element (132), a resistance sensing circuit (101) for detecting changes in the value of the resistance element and providing an alarm signal in respect to the changes in the value of the resistance element characterized in that
the resistance sensing circuit comprises a first transistor (109) connected directly to the resistance element and a second transistor also connected directly to the resistance element, the first transistor being turned on responsive to an increase in the value of the resistance element and the second transistor being turned on responsive to a decrease in the value of the resistance element.

2. The tamper protection arrangement as set forth in claim 1 further characterized in that the resistance element is connected between the base of the first transistor and a reference potential, the emitter of the second transistor also being connected to the base of the first transistor.

3. The tamper protection arrangement of claim 2 further characterized in that the resistance sensing circuit further includes a resistor (110), the value of said resistor being proportional to that of the resistance element so as to bias the first transistor off such that a small change in the base voltage of the first transistor causes it to switch on, the resistor having one side connected to the base of the first transistor and the other side connected to a positive reference potential.

4. The tamper protection arrangement of claim 3 further characterized in that the resistance sensing circuit further includes a diode (114) and a second resistor (112), one side of the diode being connected to the emitter of the first transistor and the other side commonly connected with one side of the second resistor to the base of the second transistor, the other side of the second resistor being connected to the positive reference potential, and the emitter of the first transistor being connected to the reference potential through a third resistor (113).

5. The tamper protection arrangement as set forth in claim 4 further characterized in that the resistance sensing circuit further includes a third transistor (116) having its emitter connected to the positive reference potential and its collector connected through a fourth resistor (118) to the reference potential, the base of the third transistor being coupled to the positive reference potential through a fifth resistor (115) and commonly coupled to the collectors of the first and second transistors for receiving an output representing a change in the value of the resistance element, a voltage reflective of the change in the value of the resistance element being developed across the fifth resistor.

6. The tamper protection arrangement of claim 3 further characterized in that the first transistor is an NPN-type silicon transistor and that the small change in the base voltage is an increase of approximately 3/10 volt.

7. The tamper protection arrangement of claim 2 further characterized in that the resistance sensing circuit further includes a resistor (110), the value of said resistor being proportional to that of the resistance element so as to bias the second transistor off such that a small change in the emitter voltage of the second transistor causes it to switch on.

8. The tamper protection arrangement of claim 7 further characterized in that the second transistor is an NPN-type silicon transistor and that the small change in the emitter voltage is a decrease of approximately 3/10 volt.

* * * * *

UNITED STATES PATENT AND TRADEMARK OFFICE
CERTIFICATE OF CORRECTION

PATENT NO. : 4,357,601

DATED : November 2, 1982

INVENTOR(S) : Stephen G. McWilliams

It is certified that error appears in the above-identified patent and that said Letters Patent is hereby corrected as shown below:

Column 1, line 59, "give" should read --given--. Column 4, line 2, "fo" should read --to--; line 32, "Registor" should read --Resistor--. Column 6, line 67, "no" should read --not--. Column 10, line 14, "claim 3" should read --claim 3 or 7--.

Signed and Sealed this

Fifteenth Day of November 1983

[SEAL]

Attest:

GERALD J. MOSSINGHOFF

Attesting Officer     Commissioner of Patents and Trademarks